(12) United States Patent
Lee

(10) Patent No.: US 12,179,147 B2
(45) Date of Patent: Dec. 31, 2024

(54) SYSTEM AND METHOD FOR TREATING EXHAUST FLUID FROM SEMICONDUCTOR MANUFACTURING EQUIPMENT

(71) Applicant: PLAN CO., LTD, Gyeonggi-do (KR)

(72) Inventor: In Cheol Lee, Gyeonggi-do (KR)

(73) Assignee: PLAN CO., LTD, Gyeonggi-do (KR)

( * ) Notice: Subject to any disclaimer, the term of this patent is extended or adjusted under 35 U.S.C. 154(b) by 696 days.

(21) Appl. No.: 17/387,229

(22) Filed: Jul. 28, 2021

(65) Prior Publication Data
US 2022/0097000 A1    Mar. 31, 2022

(30) Foreign Application Priority Data
Sep. 28, 2020 (KR) .................. 10-2020-0125662

(51) Int. Cl.
*B01D 53/92* (2006.01)
*B01D 53/32* (2006.01)
(Continued)

(52) U.S. Cl.
CPC ............. *B01D 53/92* (2013.01); *B01D 53/32* (2013.01); *B01D 53/38* (2013.01);
(Continued)

(58) Field of Classification Search
CPC ........ B01D 53/92; B01D 53/32; B01D 53/38; B01D 2258/0216; B01D 2259/818;
(Continued)

(56) References Cited

U.S. PATENT DOCUMENTS

| 2007/0095282 A1 | 5/2007 | Moon et al. |
| 2013/0171919 A1 | 7/2013 | Shinohara et al. |

FOREIGN PATENT DOCUMENTS

| CN | 104220145 A | 12/2014 |
| CN | 109155232 A | 1/2019 |

(Continued)

OTHER PUBLICATIONS

Office Action mailed by The State Intellectual Property Office of People's Republic of China dated Mar. 30, 2024, in corresponding Chinese Patent Application No. 202110782114.6 and English translation (Global Dossier).

*Primary Examiner* — Thuan D Dang
(74) *Attorney, Agent, or Firm* — Locke Lord LLP; Scott D. Wofsy; Gabrielle L. Gelozin (57) ABSTRACT

Disclosed is a system for treating exhaust fluid from semiconductor manufacturing equipment in which cleaning gases decomposed by a plastic apparatus alternately flow towards a front rotor region (a main rotor unit) and a rear rotor region (a subsidiary rotor unit) of a booster pump and then flow towards a dry pump, and thus uniformly react with process byproducts present throughout the whole area in a vacuum pump including the booster pump and the dry pump so as to improve removal efficiency of the process byproducts. Further, the retention time of the cleaning gases decomposed by the plasma apparatus in the vacuum pump is increased by adjusting the pressure in the pump with the rotational speed of a motor, and thus the reaction time of the cleaning gases with the process byproducts is increased, so as to further improve removal efficiency of the process byproducts, such as $SiO_2$ powder.

8 Claims, 7 Drawing Sheets

(51) Int. Cl.
*B01D 53/38* (2006.01)
*C23C 16/44* (2006.01)

(52) U.S. Cl.
CPC .. *C23C 16/4412* (2013.01); *B01D 2258/0216* (2013.01); *B01D 2259/818* (2013.01)

(58) Field of Classification Search
CPC .. B01D 2256/18; B01D 53/346; B01D 53/68; B01D 2257/2027; B01D 2257/204; B01D 2257/2047; B01D 2257/2066; C23C 16/4412; C23C 16/4405; F04C 18/126; F04C 2220/12; F04C 2220/30; F04C 2240/403; F04C 23/001; F04C 25/02; F04C 28/08; Y02C 20/30; F04B 17/03; F04B 41/06; F04B 37/14; F04B 49/20; F04B 49/24; F04D 19/04; F04D 29/701; H01J 37/32844; H01J 37/32862; H01J 37/32834
See application file for complete search history.

(56) References Cited

FOREIGN PATENT DOCUMENTS

| | | | |
|---|---|---|---|
| JP | 2001053008 | A | 2/2001 |
| JP | 2007043171 | A | 2/2007 |
| JP | 2019012812 | A | 1/2019 |
| KR | 20140010686 | A | 1/2014 |
| KR | 20150119687 | A | 10/2015 |
| KR | 20170054666 | A | 5/2017 |
| KR | 10-1792633 | B1 | 11/2017 |
| KR | 10-2018-0105358 | A | 9/2018 |

SYSTEM AND METHOD FOR TREATING EXHAUST FLUID FROM SEMICONDUCTOR MANUFACTURING EQUIPMENT

CROSS-REFERENCE TO RELATED APPLICATION

This application claims under 35 U.S.C. § 119(a) the benefit of priority to Korean Patent Application No. 10-2020-0125662 filed on Sep. 28, 2020, the entire contents of which are incorporated herein by reference.

BACKGROUND

(a) Technical Field

The present disclosure relates to a system and method for treating exhaust fluid from semiconductor manufacturing equipment. More particularly, it relates to a system and method for treating exhaust fluid from semiconductor manufacturing equipment in which a plasma apparatus is installed on a vacuum pump for treatment of the exhaust fluid discharged from the semiconductor manufacturing equipment and a bypass pipe configured to recycle a part of the fluid passing through the plasma apparatus to an inlet is also installed thereon, so as to greatly improve decomposition and treatment efficiency of process byproduct gases flowing along the inner pipes of the vacuum pump.

(b) Background Art

In general, among manufacturing processes of semiconductors, display panels, solar cells, etc., processes such as etching, deposition, cleaning and nitriding are performed in a process chamber.

Gases used in the above manufacturing processes include volatile organic compounds, acid-based materials, odor producing materials, pyrophoric gases, and materials causing global warming, and these gases are converted into process byproducts, such as unreacted gas, waste gas, etc., via the manufacturing processes and are thus discharged from a process chamber to a vacuum pump.

Among the process byproducts, such as unreacted gas, waste gas, etc., HF, fluorides, chlorides, etc. move through the vacuum pump and the insides of pipes and thus cause corrosion of metal surfaces, and most of gases used in the manufacturing processes are environmental pollutants and must thus be removed before they are finally discharged into the atmosphere.

Further, while fine particles and metals generated during the manufacturing processes pass through parts installed in various transfer paths in which fluid is transferred, such as pipes, the fine particles and metals transition to a powder form (for example, $SiO_2$ powder) via a phase transition process due to cooling or a change in pressure, and such powder may shorten the lifespan of the vacuum pump.

For example, a vacuum atmosphere is created in the process chamber by suction of the vacuum pump connected to the process chamber by a vacuum line, and reaction gases or process byproducts suctioned by the vacuum pump are discharged to the outside through an exhaust line.

Here, the process byproducts are cooled and thus grown in a powder form while passing through pipes configured to connect the process chamber and the vacuum pump, and are accumulated on a rotor in the vacuum pump as time passes by, and such accumulation of the powder deteriorates the performance of the vacuum pump and shortens the lifespan of the vacuum pump.

Therefore, a vacuum pump cleaning method, which treats process byproducts using plasma reaction carried out in front of or behind a vacuum pump, is widely used, and such a method using plasma may prevent a waste of energy, improve fluidity of solid-type process byproducts introduced into the vacuum pump so as to reduce the amount of accumulation of the solid-type process byproducts in the vacuum pump, thus extending the lifespan of the vacuum pump and thereby being widely used now.

Figure 1:
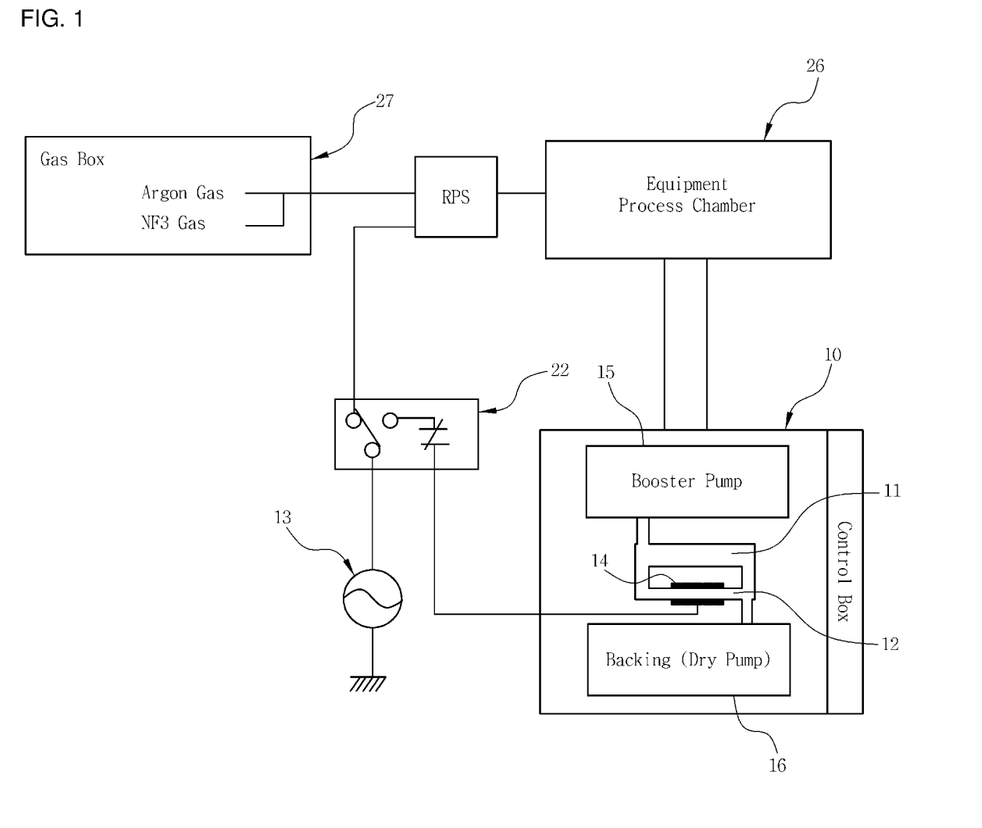
FIG. 1 is a schematic diagram illustrating a conventional apparatus for treating exhaust fluid from semiconductor manufacturing equipment.

FIG. 1 is a schematic diagram illustrating a conventional apparatus for treating exhaust fluid from semiconductor manufacturing equipment.

As shown in FIG. 1, the semiconductor manufacturing equipment includes a process chamber 26 configured to perform various manufacturing processes, and a vacuum pump 10 including a booster pump 15 and a dry pump 16 so as to maintain a vacuum state within the process chamber 26, and when the vacuum pump 10 is operated, exhaust fluid, for example, various process byproduct gases, such as unreacted gas, waste gas, etc., in the process chamber 26 is discharged to the vacuum pump 10.

A generator 13 configured to supply power to the process chamber 26, and a gas box 27 configured to supply process gases or cleaning gases are provided.

The generator 13 may not only serve to supply power to the process chamber 26 but also serve to apply voltage to a coil 14 on a plasma pipe 12.

A vacuum relay 22 configured to selectively open and close paths of voltage applied to the process chamber 26 and the coil 14 in connection with use of the generator 13 is provided, and thereby, voltage may be selectively supplied to the process chamber 26 and the coil 14.

Further, as the inner pipes of the vacuum pump 10, for example, a plurality of pipes configured to connect the booster pump 15 and the dry pump 16 may be provided, and at least one of these pipes may be used as a pipe in which plasma reaction is performed so as to decompose the cleaning gases.

For example, two pipes, i.e., a main pipe 11 and a plasma pipe 12, are installed so as to be connected to each other between the booster pump 15 and the dry pump 16 of the vacuum pump 10.

Therefore, the cleaning gases from the booster pump branch off into the main pipe 11 and the plasma pipe 12, flow along the respective pipes 11 and 12, and are supplied to the dry pump 16. Here, when voltage is applied to the coil 14, plasma discharge may be induced in the plasma pipe 12 so as to decompose the cleaning gases passing through the plasma pipe 12.

For example, during a vacuum pump cleaning process, in the situation in which cleaning gases, such as Ar gas and/or $NF_3$ gas, are supplied from the gas box 27, when Ar gas and/or $NF_3$ gas flow in the plasma pipe 12, the gases are decomposed into Ar gas, $N_2$ gas and $F_2$ gas through plasma discharge (here, Ar gas is used to increase plasma efficiency), the decomposed gases are transmitted to the dry pump 16 and react with $SiO_2$ powder in the dry pump 16, and thus, $SiF_4$ gas, $N_xO$ gas and $N_2$ gas are finally discharged, thereby being capable of removing $SiO_2$ powder deposited in the dry pump 16.

Here, in addition to Ar gas and $NF_3$ gas, $C_xF_y$ gas, such as $ClF_3$, $CF_4$, $C_2F_6$ or $C_3F_8$, and $F_2$ gas may be used as the cleaning gases.

As such, the cleaning gases flowing from the booster pump 15 to the dry pump 16 flow along a plurality of pipes arranged parallel to each other, the cleaning gases passing through the plasma pipe 12 may be decomposed by the plasma reaction, and the decomposed gases may react with powder deposited in the dry pump 16, for example, $SiO_2$ powder, thereby being capable of cleaning the vacuum pump 10.

However, because the cleaning gases flowing in the booster pump 15 of the vacuum pump 10, which is applied to semiconductor manufacturing equipment, are not in a plasma discharge-treated state, the removal efficiency of process byproducts (for example, $SiO_2$ powder) deposited in the booster pump 15 may be lowered. That is, because the coil 14 and the plasma pipe 12 are disposed between the booster pump 15 and the dry pump 16, the process byproducts (for example, $SiO_2$ powder) present in the booster pump 15 may not be easily removed by the cleaning gases which are not in the plasma discharge-treated state.

Further, when the dry pump 16 connected to the booster pump 15 is a multi-stage pump in which a plurality of rotors is mounted on one rotating shaft (for example, a five-stage pump), the dry pump 16 has a large inner area and a long cleaning gas flow path, and thus, the removal efficiency of process byproducts (for example, $SiO_2$ powder) deposited in the dry pump 16 may also be lowered.

Therefore, measures, in which cleaning gases decomposed through plasma reaction are uniformly distributed throughout the whole area in a vacuum pump including a booster pump and a dry pump so as to easily remove process byproducts, such as $SiO_2$ powder, throughout the whole area in a vacuum pump, are required.

The above information disclosed in this Background section is only for enhancement of understanding of the background of the invention and therefore it may contain information that does not form the prior art that is already known in this country to a person of ordinary skill in the art.

RELATED ART DOCUMENT

Patent Document

Patent Document 1: Korean Patent Registration No. 10-1792633 (Oct. 26, 2017)

SUMMARY OF THE DISCLOSURE

The present invention has been made in an effort to solve the above-described problems associated with the prior art, and it is an object of the present invention to provide a system and method for treating exhaust fluid from semiconductor manufacturing equipment in which cleaning gases decomposed by a plastic apparatus alternately flow towards a front rotor region (a main rotor unit) and a rear rotor region (a subsidiary rotor unit) of a booster pump and then flow towards a dry pump, and thus uniformly react with process byproducts (for example, $SiO_2$ powder) present throughout the whole area in a vacuum pump including the booster pump and the dry pump so as to improve removal efficiency of the process byproducts.

It is another object of the present invention to provide a system and method for treating exhaust fluid from semiconductor manufacturing equipment in which the retention time of cleaning gases decomposed by a plasma apparatus in a vacuum pump is increased by adjusting the pressure in the vacuum pump with the rotational speed of a motor, and thus the reaction time of the cleaning gases with process byproducts is increased, so as to further improve removal efficiency of the process byproducts.

In one aspect, the present invention provides a system for treating exhaust fluid from semiconductor manufacturing equipment, the system including a vacuum pump housing having a gas inlet formed at one side thereof and a gas outlet formed at a remaining side thereof so as to be connected to a dry pump, a partition configured to divide an inner space of the vacuum pump housing into a front space configured to communicate with the gas inlet and a rear space configured to communicate with the gas outlet, a rotating shaft rotatably installed within the front space and the rear surface of the vacuum pump housing, a plurality of main rotors mounted on the rotating shaft and disposed in the front space, a plurality of subsidiary rotors mounted on the rotating shaft and disposed in the rear space, a motor connected to the rotating shaft, an inverter configured to control driving of the motor, a plasma apparatus connected to the front space via a first connection pipe so as to communicate with the front space, and connected to the rear space via a second connection pipe so as to communicate with the rear space, a bypass pipe configured to connect the plasma apparatus to the gas inlet of the vacuum pump housing, an opening and closing valve mounted on the bypass pipe, and a controller configured to control a motor rotational speed through the inverter and to open and close the opening and closing valve on a designated cycle.

In a preferred embodiment, cleaning gases introduced through the gas inlet may be supplied to the plasma apparatus via the front space provided with the main rotors disposed therein and be decomposed through plasma discharge in the plasma apparatus, and a part of the cleaning gases may pass through the bypass pipe in an open state of the opening and closing valve and again be supplied to the front space provided with the main rotors disposed therein the gas inlet, or the cleaning gases introduced through the gas inlet may be supplied to the plasma apparatus via the front space provided with the main rotors disposed therein, be decomposed through plasma discharge in the plasma apparatus, be supplied to the rear space provided with the subsidiary rotors disposed therein in a closed state of the opening and closing valve, and be discharged to the dry pump.

In another preferred embodiment, a pressure sensor configured to measure a pressure of the vacuum pump housing and to transmit the measured pressure to the controller may be mounted at the gas inlet.

In still another preferred embodiment, the controller may be configured to apply a control signal for decreasing the motor rotational speed to the inverter so as to increase the suction pressure of the booster pump to a pressure set to lengthen a retention time of the cleaning gases in the vacuum pump housing based on a measurement signal from the pressure sensor.

In yet another preferred embodiment, a gas byproduct detector configured to detect an amount of byproducts of cleaning gases after reaction with process byproducts and to transmit the detected amount to the controller may be mounted at the gas outlet of the vacuum pump housing or at an outlet pipe of the dry pump.

In still yet another preferred embodiment, the controller may maintain operation of the plasma apparatus and adjustment of the motor rotational speed, as a result of detection of the byproducts by the gas byproduct detector, when the amount of the byproducts is equal to or greater than a threshold, and may stop supply of the cleaning gases, stop operation of the plasma apparatus and drive the motor so as to return the motor to an original rotational speed thereof, when the amount of the byproducts is less than the threshold.

In a further preferred embodiment, bypass pipe connection holes configured to connect the bypass pipe to the vacuum pump housing and a front space connection passage and a rear space connection passage connected to the plasma apparatus so as to circulate gases therebetween may be formed in the vacuum pump housing, and the bypass pipe configured to communicate with the bypass pipe connection holes may be directly formed in the plasma apparatus.

In another aspect, the present invention provides a method for treating exhaust fluid from semiconductor manufacturing equipment, the method including supplying cleaning gases into a vacuum pump housing, supplying the cleaning gases to a plasma apparatus via a front space provided with main rotors disposed therein, decomposing the cleaning gases through plasma discharge in the plasma apparatus, when an opening and closing valve of a bypass pipe configured to connect the plasma apparatus to a gas inlet of the vacuum pump housing is opened, supplying the cleaning gases decomposed by the plasma apparatus to the front space via the bypass pipe so as to react with process products in the front space, when the opening and closing valve is closed, supplying the cleaning gases decomposed by the plasma apparatus to a rear space of the pump housing so as to react with process byproducts in the rear space, and discharging the cleaning gases to a dry pump after reaction with the process byproducts.

In a preferred embodiment, the method may further include controlling, by a controller, a rotational speed of a motor based on a measurement signal from a pressure sensor so as to increase a suction pressure of the vacuum pump to a set pressure, before or while the decomposed cleaning gases are supplied to the front space or the rear space In another preferred embodiment, an inverter may adjust the rotational speed of the motor to a lower speed than a rated rotational speed depending on a current command from the controller so as to increase the suction pressure of the vacuum pump to a pressure set to lengthen a retention time of the cleaning gases in the vacuum pump housing.

In still another preferred embodiment, the method may further include measuring, by a gas byproduct detector mounted at an outlet pipe of the dry pump, an amount of byproducts of the cleaning gases after reaction with the process byproducts, comparing the measured amount of the byproducts with a threshold, determining, by the controller, that cleaning of the vacuum pump has not yet been completed, and thus, maintaining operation of the plasma apparatus and simultaneously maintaining adjustment of the rotational speed of the motor, as a result of comparison, when the amount of the byproducts is equal to or greater than the threshold, and determining, by the controller, that cleaning of the vacuum pump to a desired level has been completed, and thus, stopping supply of the cleaning gases, stopping operation of the plasma apparatus and driving the motor so as to return the motor to an original rotational speed thereof, when the amount of the byproducts is less than the threshold.

Other aspects and preferred embodiments of the invention are discussed infra.

The above and other features of the invention are discussed infra.

BRIEF DESCRIPTION OF THE DRAWINGS

The above and other features of the present invention will now be described in detail with reference to certain exemplary embodiments thereof illustrated in the accompanying drawings which are given hereinbelow by way of illustration only, and thus are not limitative of the present invention, and wherein.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes, will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that the present description is not intended to limit the invention to the exemplary embodiments. On the contrary, the invention is intended to cover not only the exemplary embodiments, but also various alternatives, modifications, equivalents and other embodiments, which may be included within the spirit and scope of the invention as defined by the appended claims.

Figure 2:
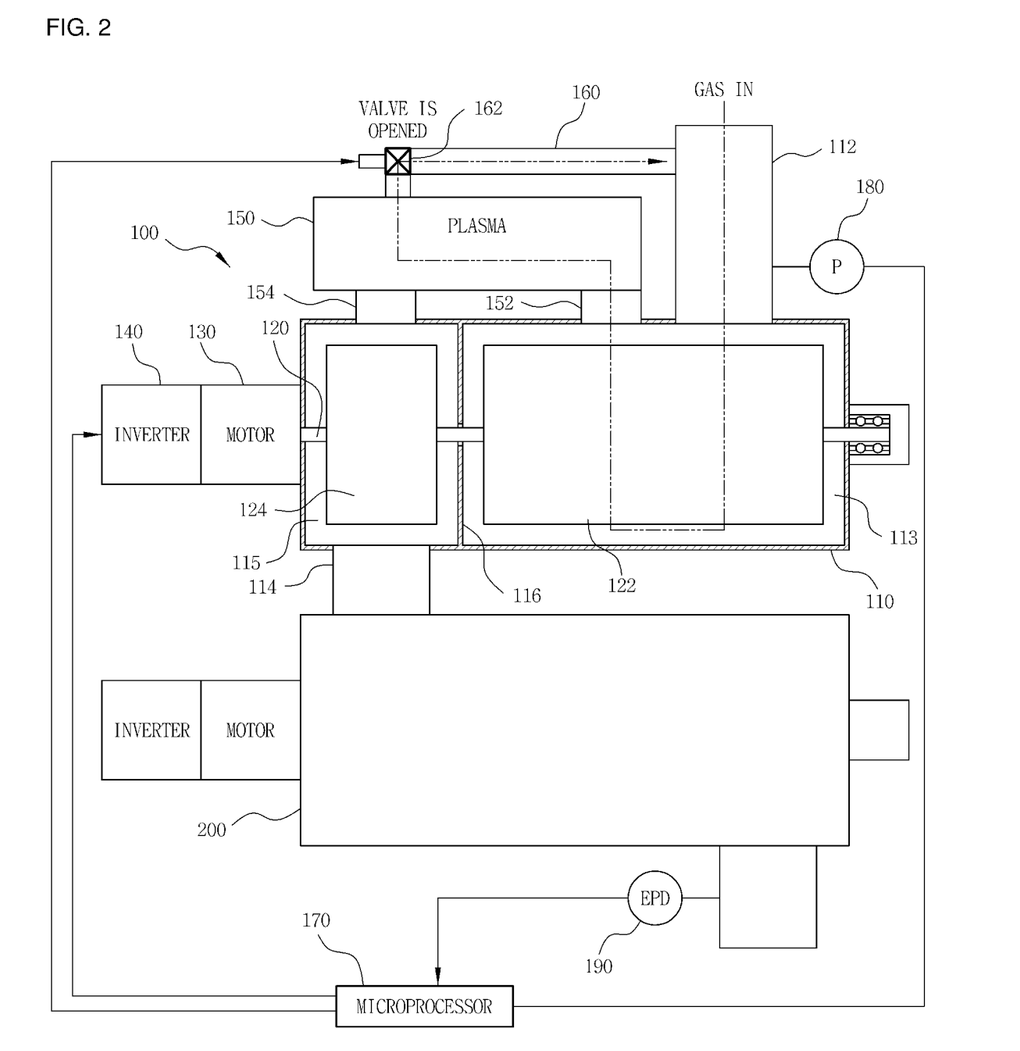
FIGS. 2 and 3 are schematic diagrams illustrating a system for treating exhaust fluid from semiconductor manufacturing equipment according to the present invention.
Figure 3:
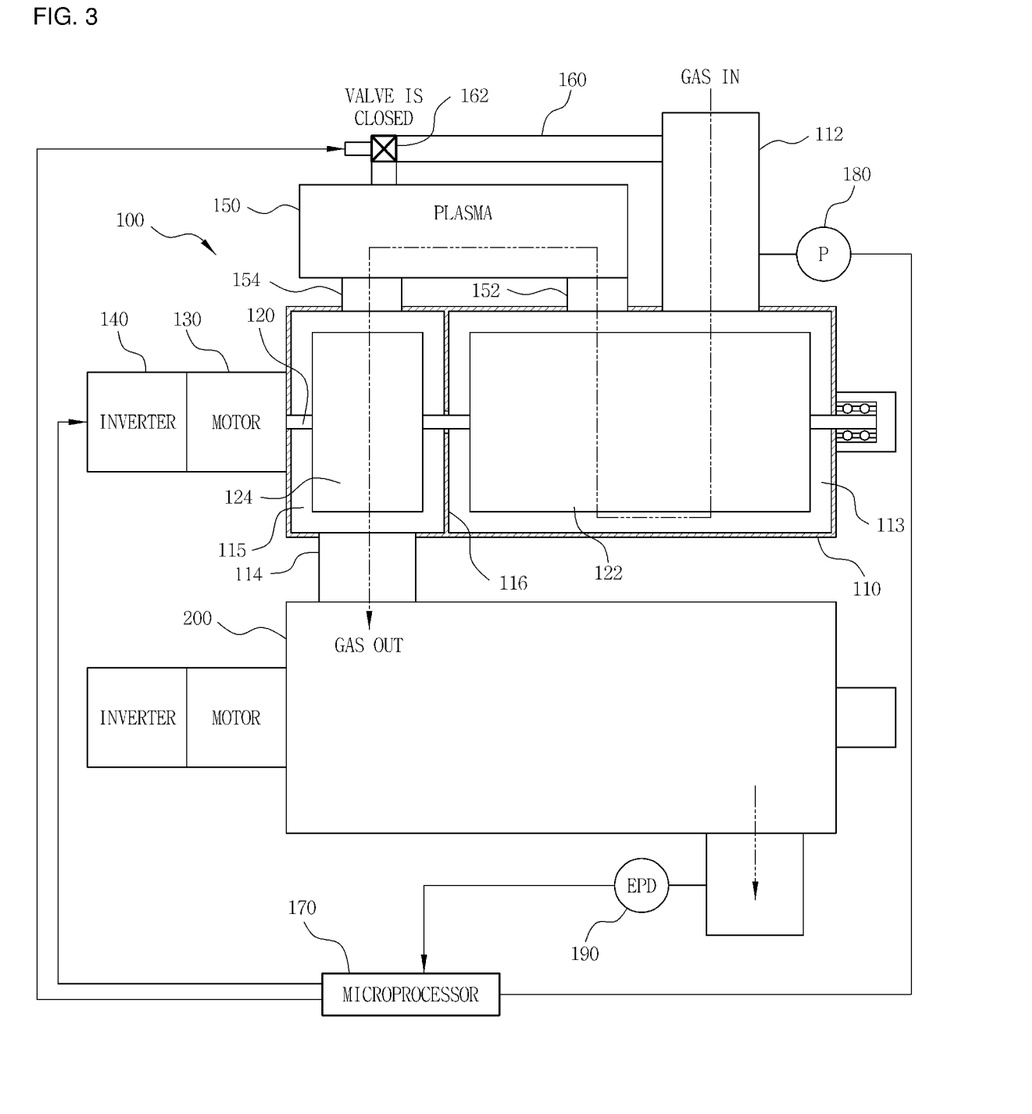

FIGS. 2 and 3 are schematic diagrams illustrating a system for treating exhaust fluid from semiconductor manufacturing equipment according to the present invention, and reference numeral 100 indicates a booster pump of a vacuum pump.

The booster pump 100 employs a multi-stage pump in which a plurality of rotors is mounted on one rotating shaft, and the multi-state pump may be employed when a process chamber in which various manufacturing processes of the semiconductor manufacturing equipment are performed requires a high vacuum state.

Accordingly, the booster pump 100 serves to provide vacuum to the process chamber requiring the vacuum state during the various manufacturing processes of the semiconductor manufacturing equipment, and various process byproduct gases, such as exhaust fluid (for example, non-reacted gas, waste gas, etc.) generated when a semiconductor manufacturing process is performed in the process chamber, flow towards a dry pump 200 via the booster pump 100.

Here, when the various process byproduct gases enter the booster pump 100, the process byproduct gases move through the booster pump 100 and the insides of pipes and thus cause corrosion of metal surfaces, and the process byproduct gases transition to a powder form, such as $SiO_2$ powder, via a phase transition process due to cooling or a change in pressure and such powder is accumulated in the vacuum pump including the booster pump 100 and the dry pump 200 and thus shortens the lifespan of the vacuum pump, and therefore, must be removed.

For this purpose, a cleaning process in which cleaning gases, such as Ar gas and/or $NF_3$ gas, $C_xF_y$ gas, such as $ClF_3$, $CF_4$, $C_2F_6$ or $C_3F_8$, and $F_2$ gas, are supplied to the booster pump 100 and decomposed by a plasma apparatus and the decomposed cleaning gases are supplied so as to remove $SiO_2$ powder, may be performed.

For example, the cleaning process of the vacuum pump including the booster pump 100 and the dry pump 20 includes supplying cleaning gases, such as Ar gas and/or $NF_3$ gas, from a gas box to the inside of a plasma pipe, decomposing the cleaning gases into Ar gas, $N_2$ gas and $F_2$ gas through plasma discharge (here, Ar gas is used to increase plasma efficiency), transmitting the decomposed gases to the booster pump 100 and the dry pump 200 so as to react with $SiO_2$ powder in the booster pump 100 and the dry pump 200, and finally discharging $SiF_4$ gas, $N_xO$ gas and $N_2$ gas, which are produced by reaction between the decomposed gases and the $SiO_2$ powder, thereby being capable of removing process byproducts, such as the $SiO_2$ powder, deposited in the booster pump 100 and the dry pump 200.

However, because the cleaning gases flowing in the booster pump 100 of the conventional vacuum pump applied to the semiconductor manufacturing equipment are not in the plasma discharge-treated state, as described above, the removal efficiency of process byproducts (for example, $SiO_2$ powder) deposited in the booster pump 100 may be lowered. Further, when the dry pump 200 connected to the booster pump 100 is a multi-stage pump in which a plurality of rotors is mounted on one rotating shaft, the dry pump 200 has a large inner area and a long cleaning gas flow path, and thus, the removal efficiency of process byproducts deposited in the dry pump 200 may also be lowered.

Therefore, in order to solve the above problems, the present invention provides a system and method for treating exhaust fluid from semiconductor manufacturing equipment in which cleaning gases decomposed by a plastic apparatus alternately flow towards a front rotor region (a main rotor unit) and a rear rotor region (a subsidiary rotor unit) of a booster pump including a plurality of rotors mounted on one rotating shaft and then flow towards a dry pump, and thus uniformly react with process byproducts (for example, $SiO_2$ powder) present throughout the whole area in a vacuum pump including the booster pump and the dry pump so as to improve removal efficiency of the process byproducts.

For this purpose, as shown in FIGS. 2 and 3, a gas inlet 112 is formed at one side of a vacuum pump housing 110 forming the body of the booster pump 100, a gas outlet 114 connected to the dry pump 200 is formed at the other side of the vacuum pump housing 110, and particularly, a partition 116 is formed in the inner space of the vacuum pump housing 110 so as to divide the inside of the vacuum pump housing 110 into a front space 113 communicating with the gas inlet 112, and a rear space 115 communicating with the gas outlet 114.

Here, one rotating shaft 120 is rotatably installed within the front space 113 and the rear surface 115 of the vacuum pump housing 110.

Further, a plurality of rotors is mounted on the rotating shaft 120, and the rotors include a main rotor 122 mounted on the rotating shaft 120 within the front space 113, and a subsidiary rotor 124 mounted on the rotating shaft 120 within the rear space 115.

Further, a motor 130 mounted on the outer surface of the vacuum pump housing 110 is connected to the rotating shaft 120 so as to transmit power to the rotating shaft 120, and an inverter 140 configured to control the speed and torque of the motor 130 depending on a command from a controller 170 is coupled to the motor 130.

The reason why the inner space of the vacuum pump housing 110 is divided into the front space 113 and the rear space 115 using the partition 116 and the main rotor 122 and the subsidiary rotor 124 are separately disposed in the front space 113 and the rear space 115 is to distribute the suction load of gases due to vacuum suction pressure caused by operation of the motor 130 and to prevent overload of the motor 130, simultaneously.

Here, a plasma apparatus 150, which is connected to the front space 113 and the rear space 115 so as to communicate therewith, is separately disposed outside the vacuum pump housing 110, or is mounted on the outer surface of the vacuum pump housing 110 integrally with the vacuum pump housing 110 via a bracket, etc.

Preferably, as shown in FIGS. 2 and 3, the plasma apparatus 150 is connected to the front space 113 of the vacuum pump housing 110 via a first connection pipe 152 so as to communicate with the front space 113, and is connected to the rear space 115 via a second connection pipe 154 so as to communicate with the rear space 115.

Figure 6:
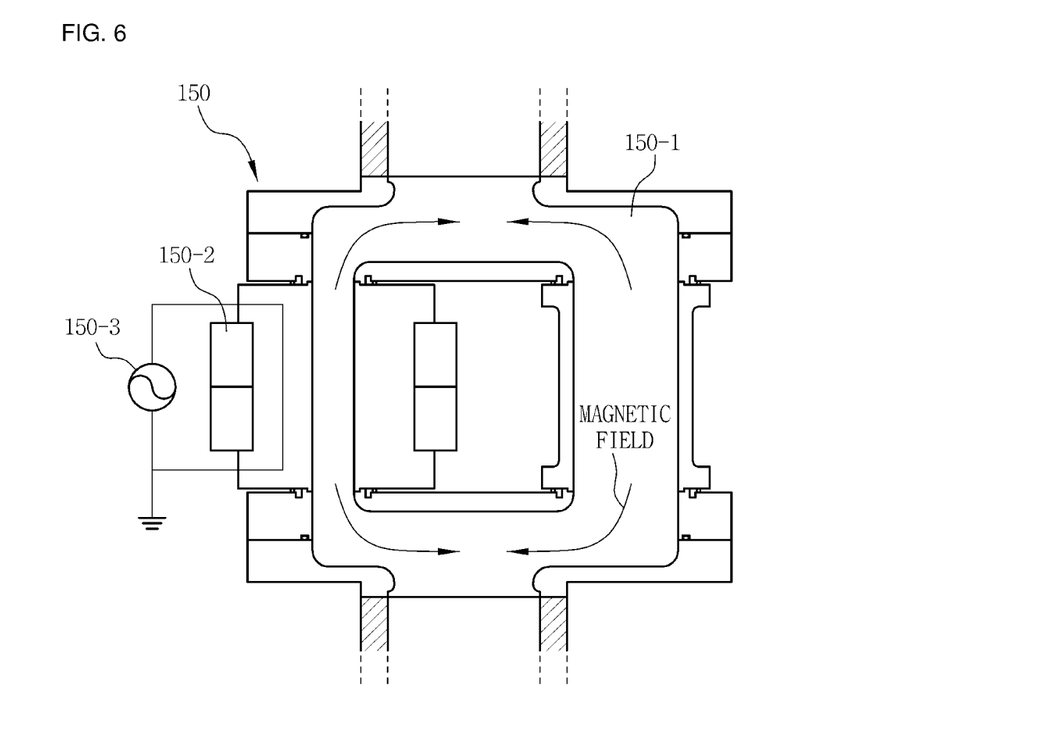
FIG. 6 is a schematic diagram illustrating a plasma generator applied to the system for treating exhaust fluid from semiconductor manufacturing equipment according to the present invention.

As one example of the plasma apparatus 150, a transformer coupled plasma (TCP)-type plasma generator may be employed.

That is, the plasma apparatus 150 includes a plasma chamber 150-1 having a hollow structure, to which the first connection pipe 152 connected to the front space 113 of the vacuum pump housing 110 and the second connection pipe 154 connected to the rear space 115 are connected, a ferrite core 150-2 mounted at the outer diameter of the plasma chamber 150-1, and a power unit 150-3 configured to supply pulse current of RF 400 kHz to the ferrite core 150-2.

Therefore, when the power unit 150-3 applies pulse current to the ferrite core 150-2, the ferrite core 150-2 converts electrical energy into a magnetic field and increases the density of the magnetic field, and thereby, the magnetic field may be formed throughout the plasma chamber 150-1 and the density and intensity of plasma within the plasma chamber 150-1 may be increased.

As another example of the plasma apparatus 150, a plasma apparatus, including a plasma pipe in which cleaning gases flow, and a coil wound on the plasma pipe so as to generate plasma by receiving voltage from a generator, may be employed. In addition, various types of plasma apparatuses may be employed.

Therefore, the present invention is characterized in that the cleaning gases decomposed by plasma generated by the plastic apparatus 150 may be alternately supplied to the front space 113 and the rear space 115 of the vacuum pump housing 110 so that the cleaning gases decomposed by the plasma apparatus 150 may be uniformly distributed throughout the whole area in the vacuum pump housing 110 and then flow to the dry pump 200.

For this purpose, a bypass pipe 160 configured to return the cleaning gases decomposed by the plasma apparatus 150 to the gas inlet 112 is provided to connect the plasma apparatus 150 to the gas inlet 112 of the vacuum pump housing 110, and an electronic opening and closing valve 162 which is opened or closed by the controller 170 so as to allow or block the flow of the cleaning gases decomposed by the plasma apparatus 150 is mounted on the bypass pipe 160.

The controller 170 is configured to control a motor rotational speed through a current command for the inverter 140, and to open and close the opening and closing valve 162 on a designated cycle.

Therefore, the cleaning gases introduced through the gas inlet 112, as shown in FIG. 2, are supplied to the plasma apparatus 150 via the front space 113 of the vacuum pump housing 110, in which the main rotor 122 is mounted, and are decomposed through plasma discharge in the plasma apparatus 150, and a part of the cleaning gases passes through the bypass pipe 160 in the open state of the opening and closing valve 162, is supplied to the front space 113 of the vacuum pump housing 110, in which the main rotor 122 is mounted, via the gas inlet 112, and reacts with $SiO_2$ in the powder form.

Further, the cleaning gases introduced through the gas inlet 112, as shown in FIG. 3, are supplied to the plasma apparatus 150 via the front space 113 of the vacuum pump housing 110, in which the main rotor 122 is mounted, are decomposed through plasma discharge in the plasma apparatus 150, are supplied to the rear space 115, in which the subsidiary rotor 124 is mounted, in the closed state of the opening and closing valve 162, and react with process byproducts, i.e., $SiO_2$ in the powder form.

In addition, the cleaning gases decomposed through plasma discharge in the plasma apparatus 150 are supplied to the rear space 115, in which the subsidiary rotor 124 is mounted, and then flow to the dry pump 200 through the gas outlet 114, thereby reacting with $SiO_2$ present in the dry pump 200.

Therefore, the cleaning gases decomposed through plasma reaction may be uniformly distributed throughout the whole area in the vacuum pump including the booster pump 100 and the dry pump 200, thereby being capable of easily removing process byproducts (for example, $SiO_2$ powder) throughout the whole area in the vacuum pump and thus improving cleaning efficiency of the vacuum pump.

Further, a pressure sensor 180 configured to measure the suction pressure of the vacuum pump and to transmit the measured suction pressure to the controller 170 is mounted at the gas inlet 112 of the vacuum pump housing 110.

Therefore, the controller 170 is configured to apply a control signal for adjusting the motor rotational speed to the inverter 140 so as to adjust the suction pressure of the vacuum pump to a pressure set to lengthen the retention time of the cleaning gases in the vacuum pump housing 110 based on the measurement signal from the pressure sensor 180.

That is, because the suction pressure of the vacuum pump including the booster pump 100 and the dry pump 200 is determined by the rotational speed of the motor 130, the controller 170 applies the control signal for adjusting the motor rotational speed to the inverter 140 during the cleaning process of the vacuum pump, and more particularly, applies the control signal for adjusting the motor rotational speed to the inverter 140 for controlling the motor 300 of the booster pump 100 and to an inverter (no reference numeral) for controlling the motor (no reference numeral) of the dry pump 200 so as to adjust the suction pressure of the vacuum pump to the pressure set to lengthen the retention time of the cleaning gases in the vacuum pump housing 110 based on the measurement signal from the pressure sensor 180.

For example, the inverter 140 may adjust the rotational speed of the motor 130 to a rated rotational speed depending on a current command from the controller 170 so as to adjust the suction pressure of the vacuum pump to a rated pressure during the semiconductor manufacturing process, but may adjust the rotational speed of the motor 130 to a lower speed than the rated rotational speed depending on a current command from the controller 170 so as to increase the suction pressure of the vacuum pump to a pressure for lengthening the retention time of the cleaning gases in the vacuum pump housing 110 during a process of cleaning the vacuum pump with the cleaning gases.

Here, as the pressure in the vacuum pump housing 110 is lower than the rated pressure, a local area to which the cleaning gases are suctioned may be effectively cleaned but the wall surface of the local area may be corroded due to intensive cleaning, but as the pressure in the vacuum pump housing is higher than the rated pressure, a time for which the cleaning gases are uniformly distributed throughout the entire space in the vacuum pump housing 110 and remain therein may be lengthened.

Therefore, the controller 170 is configured to apply the control signal for adjusting the motor rotational speed to the inverter 140 for controlling the motor 300 of the booster pump 100 and to the inverter for controlling the motor of the dry pump 200 so as to increase the suction pressure of the booster pump 100 and the dry pump 200 to the pressure set to lengthen the retention time of the cleaning gases in the vacuum pump housing 110 based on the measurement signal from the pressure sensor 180.

Therefore, when the cleaning gases decomposed by the plasma apparatus 150 are alternately supplied to the front space 113 and the rear space 115 of the vacuum pump housing 110 and then flow to the dry pump 120, the inner pressure of the vacuum pump housing 110 may be increased to the pressure set to lengthen the retention time of the cleaning gases in the vacuum pump housing 110, thereby being capable of increasing the retention time of the cleaning gases, increasing the reaction time of the cleaning gases with $SiO_2$ powder, and thus improving removal efficiency of the $SiO_2$ powder.

Further, a gas byproduct detector, such as an energetic particle detector (EPD), 190 configured to detect the amount of byproducts of the cleaning gases after reaction with the $SiO_2$ powder and to transmit the detected amount to the controller 170 may be mounted at the gas outlet 114 of the vacuum pump housing 110.

Preferably, the gas byproduct detector 190 may be mounted at the position of an outlet pipe 202 of the dry pump 200 so as to detect the amount of byproducts of the cleaning gases after reaction with the process byproducts and to transmit the detected amount to the controller 170, and the reason for this is to measure the amount of the byproducts of the cleaning gases after reaction with the process byproducts while passing through not only the booster pump 100 but also the dry pump 200.

For example, the gas byproduct detector 190 may employ a kind of gas detector configured to measure the concentration or the content of $SiF_4$ gas after reaction with the $SiO_2$ powder.

Therefore, the controller 170 stops operation of the plasma apparatus 150 and drives the motor 130 so as to return the motor 130 to the original rotational speed thereof when the amount of the byproducts (for example, the concentration of $SiF_4$ gas after reaction with the $SiO_2$ powder) is less than a threshold, and maintains operation of the plasma apparatus 150 and simultaneously maintains adjustment of the rotational speed of the motor when the amount of the byproducts (for example, the concentration of $SiF_4$ gas after reaction with the $SiO_2$ powder) is equal to or greater than the threshold, based on a detection signal from the gas byproduct detector 190.

That is, the controller 170 determines that cleaning of the vacuum pump to a desired level has been completed, and thus, stops supply of the cleaning gases, stops the operation of the plasma apparatus 150 and drives the motor 130 so as to return the motor 130 to the original rotational speed thereof, when the amount of the byproducts (for example, the concentration of $SiF_4$ gas after reaction with the $SiO_2$ powder) is less than the threshold, and determines that cleaning of the vacuum pump has not yet been completed, and thus, maintains operation of the plasma apparatus 150 and simultaneously maintains adjustment of the rotational speed of the motor, when the amount of the byproducts (for example, the concentration of $SiF_4$ gas after reaction with the $SiO_2$ powder) is equal to or greater than the threshold, based on the detection signal from the gas byproduct detector 190.

Hereinafter, a method for treating exhaust fluid using the system for treating exhaust fluid having the above-described configuration according to the present invention will be described with reference to FIGS. 2 to 5.

Figure 4:
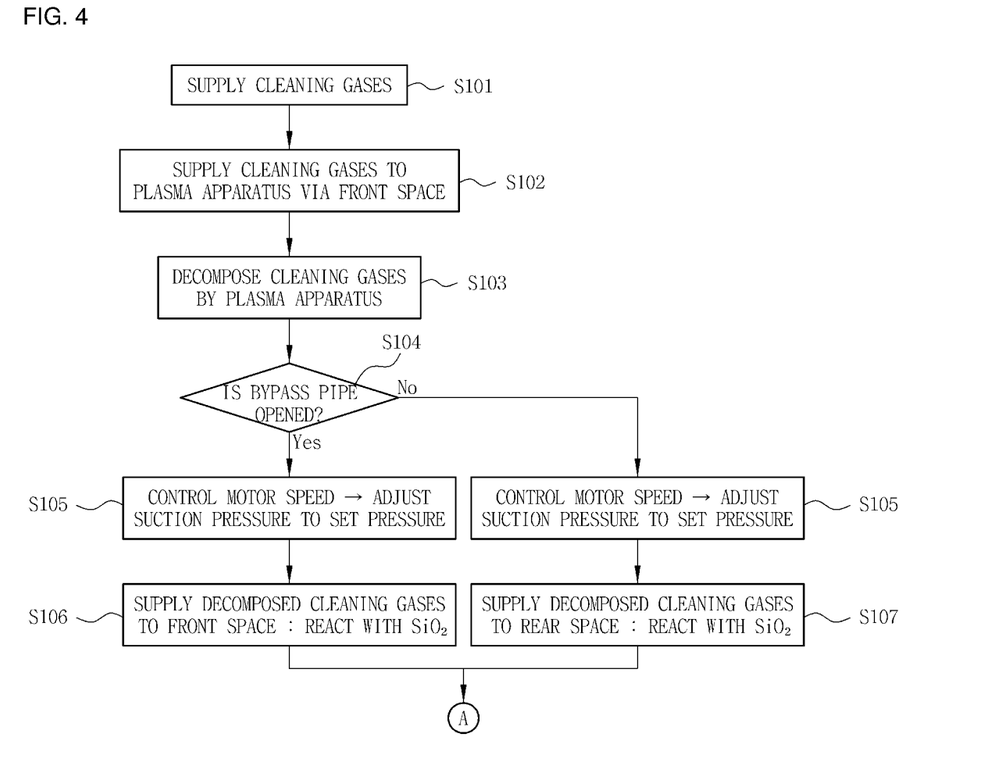
FIGS. 4 and 5 are flowcharts illustrating a method for treating exhaust fluid from semiconductor manufacturing equipment according to the present invention.

First, in order to perform the cleaning process of the vacuum pump, cleaning gases, such as Ar gas and/or $NF_3$ gas, are supplied from the gas box serving as a gas source to the inside of the vacuum pump housing 110 via the gas inlet 112 of the vacuum pump housing 110 (S101).

Thereafter, the cleaning gases pass through the front space 113 of the vacuum pump housing 110, in which the main rotor 122 is mounted, and are supplied to the plasma apparatus 150 through the first connection pipe 152 (S102).

Subsequently, the cleaning gases, i.e., Ar gas and $NF_3$ gas, are decomposed into Ar gas, $N_2$ gas and $F_2$ gas (here, Ar gas is used to increase plasma efficiency) through plasma discharge in the plasma apparatus 150, or, when $NF_3$ gas alone is used as cleaning gas, the cleaning gas is decomposed into $N_2$ gas and $F_2$ gas (S103).

Here, the opening and closing valve 162 is opened and closed on a designated cycle under the control of the controller 170.

Therefore, when the opening and closing valve 162 is opened (Yes in S104), the cleaning gases decomposed through plasma discharge in the plasma apparatus 150 pass through the gas inlet 112 of the vacuum pump housing 110 via the bypass pipe 160, are supplied to the front space 113 of the vacuum pump housing 110, in which the main rotor 122 is mounted, and react with process byproducts (for example, $SiO_2$ powder) in the front space 113 (S106).

Further, the decomposed cleaning gases react with the process byproducts (for example, $SiO_2$ powder) and are converted into $SiF_4$ gas, $N_xO$ gas and $N_2$ gas, and $SiF_4$ gas, $N_xO$ gas and $N_2$ gas pass through the plasma apparatus 150, the second connection pipe 154 and the rear space 155 and are discharged to the dry pump 200 through the gas outlet 114.

On the other hand, when the opening and closing valve 162 is closed (No in S104), the cleaning gases decomposed through plasma discharge in the plasma apparatus 150 are supplied to the rear space 115, in which the subsidiary rotor 124 is mounted, and react with process byproducts (for example, $SiO_2$ powder) in the rear space 115 (S107), the decomposed cleaning gases react with the process byproducts (for example, $SiO_2$ powder) and are converted into $SiF_4$ gas, $N_xO$ gas and $N_2$ gas, and $SiF_4$ gas, $N_xO$ gas and $N_2$ gas are discharged to the dry pump 200 through the gas outlet 114.

Here, before or while the decomposed cleaning gases are supplied to the front space 113 or the rear space 115, the controller 170 may control the rotational speed of the motor 130 based on the measurement signal from the pressure sensor 180 so as to increase the suction pressure of the vacuum pump to a set pressure (S105).

For example, the inverter 140 may adjust the rotational speed of the motor 130 to a rated rotational speed depending on a current command from the controller 170 so as to adjust the suction pressure of the vacuum pump to a rated pressure during the semiconductor manufacturing process, but may adjust the rotational speed of the motor 130 to a lower speed than the rated rotational speed depending on a current command from the controller 170 so as to increase the suction pressure of the vacuum pump to a pressure set to lengthen the retention time of the cleaning gases in the vacuum pump housing 110 during the process of cleaning the vacuum pump with the cleaning gases based on Operation 105.

Further, the inverter (no reference numeral) for controlling the motor of the dry pump 200 may adjust the rotational speed of the motor (no reference numeral) of the dry pump 200 to a lower speed than the rated rotational speed depending on a current command from the controller 170 so as to increase the inner pressure of a housing of the dry pump 200 to a pressure set to lengthen the retention time of the cleaning gases in the dry pump 200.

Therefore, when the cleaning gases decomposed by the plasma apparatus 150 are alternately supplied to the front space 113 and the rear space 115 of the vacuum pump housing 110 of the booster pump 100, the retention time of the cleaning gases in the vacuum pump housing 110 may be increased, and thus, the reaction time of the cleaning gases with the process byproducts (for example, $SiO_2$ powder) and removal efficiency of the process byproducts (for example, $SiO_2$ powder) in the booster pump 100 may be further improved.

Further, after the cleaning gases decomposed by the plasma apparatus 150 are alternately supplied to the front space 113 and the rear space 115 of the vacuum pump housing 110 of the booster pump 100, the cleaning gases are discharged to the dry pump 200 through the gas outlet 114, the retention time of the cleaning gases in the dry pump 200 may be increased, and thus, the reaction time of the cleaning gases with the process byproducts (for example, $SiO_2$ powder) in the dry pump 200 may be increased and removal efficiency of the process byproducts (for example, $SiO_2$ powder) in the dry pump 200 may be improved.

Figure 5:
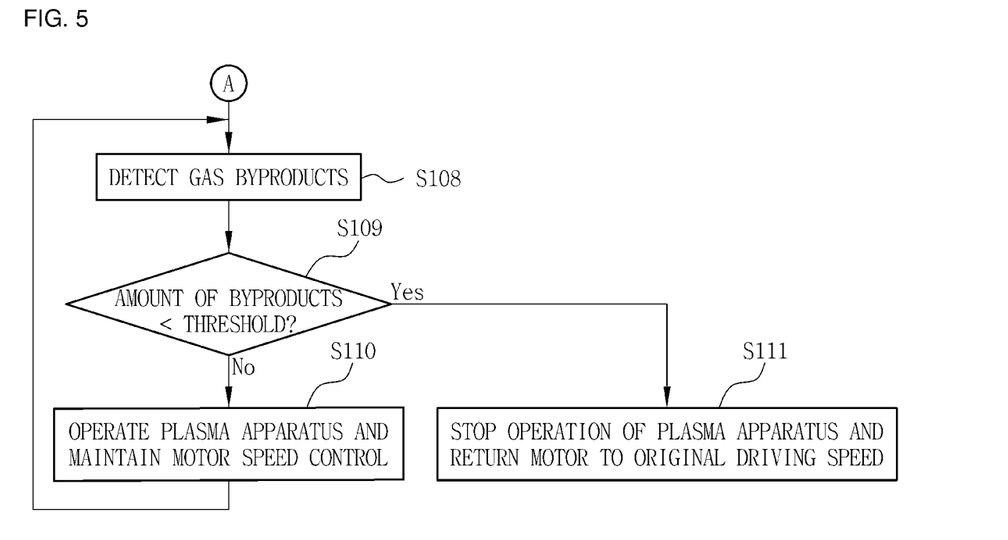

Thereafter, the gas byproduct detector 190 mounted at the outlet pipe 202 of the dry pump 200 measures the amount of byproducts of the cleaning gases after reaction with the process byproducts (for example, $SiO_2$ powder) (S108).

Thereafter, the controller 170 compares the measured amount of the byproducts (for example, the concentration of $SiF_4$ gas after reaction with the $SiO_2$ powder) with a threshold, based on the detection signal from the gas byproduct detector 190 (S109).

As a result of the comparison, when the amount of the byproducts (for example, the concentration of $SiF_4$ gas after reaction with the $SiO_2$ powder) is equal to or greater than the threshold, the controller 170 determines that cleaning of the vacuum pump has not yet been completed, and thus, maintains operation of the plasma apparatus 150 and simultaneously maintains adjustment of the rotational speed of the motor (S110).

On the other hand, when the amount of the byproducts (for example, the concentration of $SiF_4$ gas after reaction with the $SiO_2$ powder) is less than the threshold, the controller 170 determines that cleaning of the vacuum pump to a desired level has been completed, and thus, stops supply of the cleaning gases, stops the operation of the plasma apparatus 150 and drives the motor 130 so as to return the motor 130 to the original rotational speed thereof (S111).

Therefore, when the cleaning gases decomposed by the plasma apparatus 150 are discharged through the gas outlet 114 after reaction with the process byproducts, such as the $SiO_2$ powder, the gas byproduct detector 190 may measure the amount of byproducts included in the discharged gases, and the controller 170 maintains operation of the plasma apparatus 150 and the motor 130 so that the cleaning gases decomposed through plasma reaction continuously react with the process byproducts in the vacuum pump, when the amount of the byproducts is equal to or greater than the threshold, thereby being capable of keeping the vacuum pump clean.

Further, the cleaning gases decomposed through plasma discharge are continuously supplied to the dry pump 200 through the gas outlet 114 of the vacuum pump housing 110 and react with the process byproducts (for example, $SiO_2$ powder) in the dry pump 200, thereby being capable easily removing the process byproducts, such as the $SiO_2$ powder, in the dry pump 200.

As described above, the cleaning gases decomposed through plasma reaction are uniformly distributed throughout the whole area in the vacuum pump including the booster pump 100 and the dry pump 200, thereby being capable of easily removing the process byproducts throughout the whole area in the vacuum pump and thus improving cleaning efficiency of the vacuum pump.

Because the first connection pipe 152 and the second connection pipe 154 configured to connect the plasma apparatus 150 to the vacuum pump housing 110 are exposed to the outside and the bypass pipe 160 is also exposed to the outside, the total size of the vacuum pump is increased, the external appearance thereof is complicated, and thus, interference with peripheral parts may occur.

Figure 7:
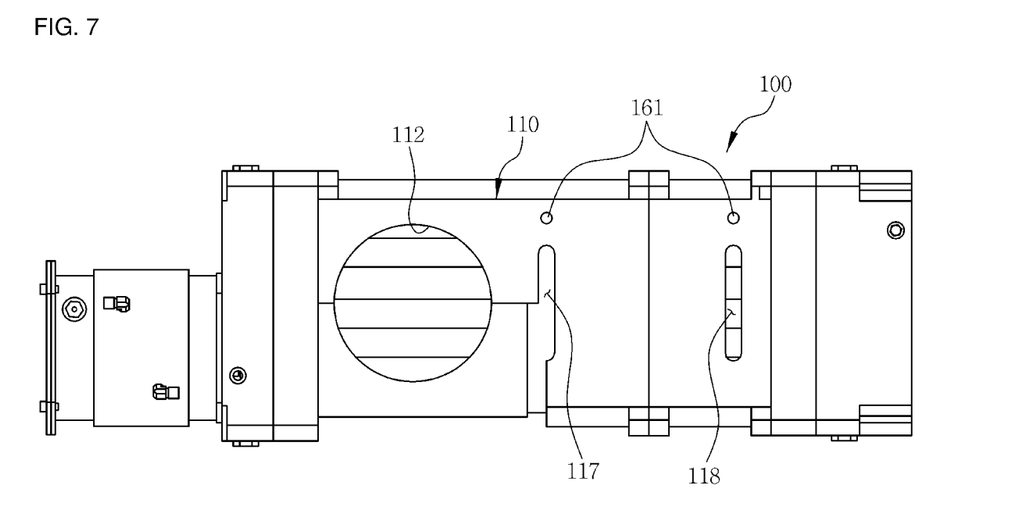
FIG. 7 is a plan view illustrating an example in which bypass pipe connection holes, a front space connection path and a rear space connection path are formed in a vacuum pump housing of the system for treating exhaust fluid from semiconductor manufacturing equipment according to the present invention.

In an effort to solve these problems, in order to integrate the plasma apparatus 150 with the vacuum pump housing 110, as shown in FIG. 7, bypass pipe connection holes 161 for connecting the bypass pipe 160 formed in the plasma apparatus 150 to the vacuum pump housing 110 may be directly formed in the vacuum pump housing 110, and a front space connection passage 117 and a rear space connection passage 118, which are connected to the plasma apparatus 150 so as to circulate gases therebetween, may be directly formed in the vacuum pump housing 110.

Figure 8:
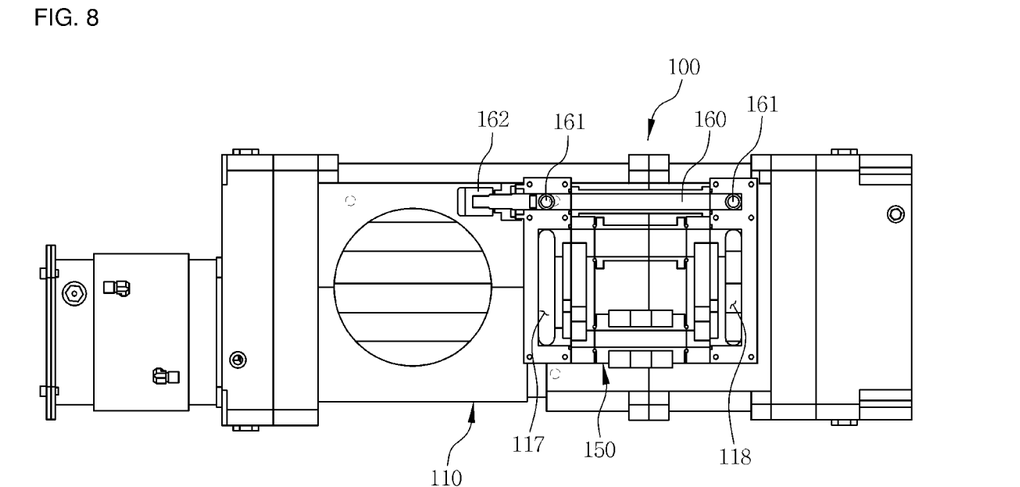
FIGS. 8 and 9 are views illustrating an example in which a bypass pipe is formed in a plasma apparatus of the system for treating exhaust fluid from semiconductor manufacturing equipment according to the present invention.
Figure 9:
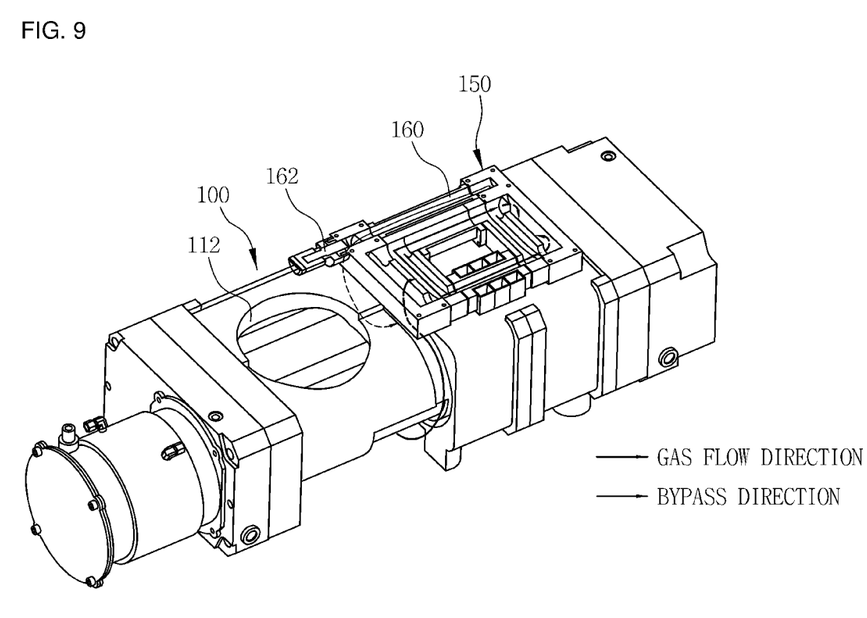

Further, as shown in FIGS. 8 and 9, the bypass pipe 160 which communicates with the bypass pipe connection holes 161 may be directly formed in the plasma apparatus 150.

Therefore, because the first connection pipe 152 and the second connection pipe 154 configured to connect the plasma apparatus 150 to the vacuum pump housing 110 may be omitted, and the bypass pipe 160 formed in the plasma apparatus 150 is not exposed to the outside, the total size of the vacuum pump may be reduced, the external appearance thereof may be simplified, and thus, interference with peripheral parts may be prevented.

As is apparent from the above description, a system and method for treating exhaust fluid from semiconductor manufacturing equipment according to the present invention provide the following effects.

First, cleaning gases decomposed through plasma reaction are uniformly distributed throughout the whole area in a vacuum pump including a booster pump and a dry pump, thereby being capable of easily removing process byproducts (for example, $SiO_2$ powder) throughout the whole area in the vacuum pump and thus improving cleaning efficiency of the vacuum pump.

Second, cleaning of the whole vacuum pump including the booster pump and the dry pump may be easily performed using only one plasma apparatus, and power consumption may be minimized due to use of one plasma apparatus.

Third, the retention time of the cleaning gases decomposed by the plasma apparatus in the vacuum pump may be increased by adjusting the pressure in the vacuum pump including the booster pump and the dry pump using the rotational speed of a motor, and thus, the reaction time of the cleaning gases with the process byproducts may be increased and removal efficiency of the process byproducts may be further improved.

Fourth, when the cleaning gases decomposed by the plasma apparatus are discharged through a gas outlet after reaction with the process byproducts, a gas byproduct detector measures the amount of byproducts included in the discharged gases, and a controller determines that cleaning of the vacuum pump has not yet been completed, and thus, maintains operation of the plasma apparatus and simultaneously maintains adjustment of the rotational speed of the motor so that the cleaning gases decomposed through plasma reaction continuously react with the process byproducts (for example, $SiO_2$ powder) in the vacuum pump, when the amount of the byproducts is equal to or greater than a threshold, thereby being capable of keeping the vacuum pump clean and thus extending the lifespan of the vacuum pump.

Fifth, the cleaning gases decomposed through plasma reaction are uniformly distributed throughout the whole area in the vacuum pump including the booster pump and the dry pump, thereby being capable of preventing corrosion due to intensive cleaning of a local area (a rotor, a housing wall or the like) with the cleaning gases and thus improving durability of the vacuum pump.

Sixth, in a conventional apparatus in which a plasma apparatus is installed at a pipe configured to connect a booster pump and a dry pump, a space in which the pipe is provided is very narrow and thus assembly work for installing the plasma apparatus is difficult and maintenance of the plasma apparatus after assembly is also difficult, but in the system for treating exhaust fluid from semiconductor manufacturing equipment according to the present, the plasma apparatus is installed in an open space above a vacuum pump housing of the booster pump, and thus installation and assembly of the plasma apparatus are very easy and the vacuum pump may have a compact size due to direct connection between the outlet of the booster pump and the inlet of the dry pump, caused by removal of the conventional plasma apparatus from the pipe configured to connect the booster pump and the dry pump.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A system for treating exhaust fluid from semiconductor manufacturing equipment, the system comprising:
- a vacuum pump housing having a gas inlet formed at one side thereof, and a gas outlet formed at a remaining side thereof so as to be connected to a dry pump;
- a partition configured to divide an inner space of the vacuum pump housing into a front space configured to communicate with the gas inlet and a rear space configured to communicate with the gas outlet;
- a rotating shaft rotatably installed within the front space and the rear surface of the vacuum pump housing;
- a plurality of main rotors mounted on the rotating shaft and disposed in the front space;
- a plurality of subsidiary rotors mounted on the rotating shaft and disposed in the rear space;
- a motor connected to the rotating shaft;
- an inverter configured to control driving of the motor;
- a plasma apparatus connected to the front space via a first connection pipe so as to communicate with the front space, and connected to the rear space via a second connection pipe so as to communicate with the rear space;
- a bypass pipe configured to connect the plasma apparatus to the gas inlet of the vacuum pump housing;
- an opening and closing valve mounted on the bypass pipe; and
- a controller configured to control a motor rotational speed through the inverter and to open and close the opening and closing valve on a designated cycle.

2. The system claim 1, wherein cleaning gases introduced through the gas inlet:
- are supplied to the plasma apparatus via the front space provided with the main rotors disposed therein and are decomposed through plasma discharge in the plasma apparatus, and a part of the cleaning gases passes through the bypass pipe in an open state of the opening and closing valve and is again supplied to the front space provided with the main rotors disposed therein the gas inlet; or
- are supplied to the plasma apparatus via the front space provided with the main rotors disposed therein, are decomposed through plasma discharge in the plasma apparatus, are supplied to the rear space provided with the subsidiary rotors disposed therein in a closed state of the opening and closing valve, and are discharged to the dry pump.

3. The system of claim 1, wherein a pressure sensor configured to measure a pressure of the vacuum pump housing and to transmit the measured pressure to the controller is mounted at the gas inlet.

4. The system of claim 3, wherein the controller is configured to apply a control signal for decreasing the motor rotational speed to the inverter so as to increase the suction pressure of the booster pump to a pressure set to lengthen a retention time of the cleaning gases in the vacuum pump housing based on a measurement signal from the pressure sensor.

5. The system of claim 1, wherein a gas byproduct detector configured to detect an amount of byproducts of cleaning gases after reaction with process byproducts and to transmit the detected amount to the controller is mounted at the gas outlet of the vacuum pump housing or at an outlet pipe of the dry pump.

6. The system of claim 5, wherein the controller maintains operation of the plasma apparatus and adjustment of the motor rotational speed, as a result of detection of the byproducts by the gas byproduct detector, when the amount of the byproducts is equal to or greater than a threshold, and stops supply of the cleaning gases, stops operation of the plasma apparatus and drives the motor so as to return the motor to an original rotational speed thereof, when the amount of the byproducts is less than the threshold.

7. The system of claim 1, wherein bypass pipe connection holes configured to connect the bypass pipe to the vacuum pump housing and a front space connection passage and a rear space connection passage connected to the plasma apparatus so as to circulate gases therebetween are formed in the vacuum pump housing.

8. The system of claim 7, wherein the bypass pipe configured to communicate with the bypass pipe connection holes is directly formed in the plasma apparatus.

* * * * *